US006815140B2

(12) United States Patent
Uetani et al.

(10) Patent No.: US 6,815,140 B2
(45) Date of Patent: Nov. 9, 2004

(54) POSITIVE RESIST COMPOSITION

(75) Inventors: Yasunori Uetani, Toyonaka (JP);
Hiroshi Moriuma, Nara (JP);
Yoshiyuki Takata, Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/323,230

(22) Filed: Jun. 1, 1999

(65) Prior Publication Data
US 2002/0006574 A1 Jan. 17, 2002

(30) Foreign Application Priority Data

Jun. 2, 1998 (JP) .......................................... 10-152735
Oct. 21, 1998 (JP) .......................................... 10-299477

(51) Int. Cl.⁷ .............................................. G03F 7/023
(52) U.S. Cl. ....................... 430/165; 430/191; 430/192; 430/193
(58) Field of Search ................................ 430/165, 191, 430/192, 193

(56) References Cited

U.S. PATENT DOCUMENTS

| | | | | | |
|---|---|---|---|---|---|
| 4,356,255 A | * | 10/1982 | Tachikawa et al. | .......... | 430/325 |
| 4,701,399 A | * | 10/1987 | Nagano et al. | ............. | 430/179 |
| 4,803,145 A | * | 2/1989 | Suzuki et al. | ................ | 430/166 |
| 5,221,592 A | * | 6/1993 | Khanna et al. | .............. | 430/165 |
| 5,252,686 A | * | 10/1993 | Aoai et al. | ................... | 430/192 |
| 5,380,620 A | * | 1/1995 | Namiki et al. | .............. | 430/257 |
| 5,547,808 A | * | 8/1996 | Watanabe | .................... | 430/176 |
| 5,576,143 A | * | 11/1996 | Aoai et al. | ................ | 430/270.1 |
| 5,612,164 A | * | 3/1997 | Canize et al. | ............... | 430/165 |
| 5,650,261 A | * | 7/1997 | Winkle | ..................... | 430/270.1 |
| 5,837,417 A | * | 11/1998 | Rahman et al. | ............. | 430/169 |

FOREIGN PATENT DOCUMENTS

EP  0662636 A2  7/1995
EP  0831371 A2  3/1998

* cited by examiner

*Primary Examiner*—John S. Chu
(74) *Attorney, Agent, or Firm*—Birch, Stewart, Kolasch & Birch, LLP

(57) ABSTRACT

A positive resist composition, having a superior resolution as well as good resist performances such as sensitivity, depth of focus and profile, is described and includes a novolac resin, a radiation-sensitive quinonediazide compound and a thioxanthone compound represented by the following formula (I):

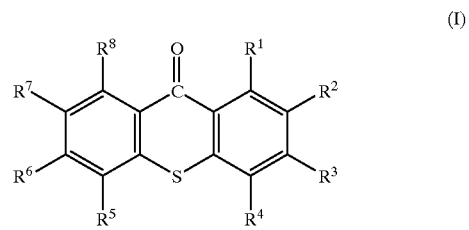

(I)

wherein $R^1$, $R^2$, $R^3$, $R^4$, $R^5$, $R^6$, $R^7$ and $R^8$ independently represent hydrogen, halogen, alkyl, alkoxy, aryl, carboxyl or alkoxycarbonyl.

5 Claims, No Drawings

POSITIVE RESIST COMPOSITION

BACKGROUND OF THE INVENTION

The present invention relates to a positive resist composition which comprises an alkali-soluble novolac resin and a radiation-sensitive quinonediazide compound and which is suitably used in processing of fine semiconductors integrated circuits.

DESCRIPTION OF RELATED ART

The fine processing of semiconductor integrated circuits has usually been performed by adopting a lithography process using a resist composition. Among the resist compositions positive working types are used in many cases because of their generally superior resolution. The positive resist compositions comprise generally an alkali-soluble ingredient and a radiation-sensitive ingredient. Specifically, they comprise a novolac resin as an alkali-soluble ingredient and a quinonediazide compound as a radiation-sensitive ingredient. Such a novolac-quinonediazide type positive resist utilizes the fact that the quinonediazide compound, which is alkali-insoluble, is decomposed by the action of radiation to generate a carboxylic group, which makes the compound alkali-soluble.

In recent years, the integrated circuit has become finer and finer with higher integration, and a pattern formation at a sub-micron level has become required. As the result, a positive resist composition having a higher resolution has become desired. For obtaining a finer pattern, so-called chemical amplification resists, which utilize the chemical amplifying effect attained by an acid-generating agent, have also been used in some field. There is still, however, a persistent need for the novolac-quinonediazide type resists.

The resolution of the novolac-quinonediazide type positive resists can be improved by increasing the amount of quinonediazide compound to some extent. However, when the amount of quinonediazide compound is increased too much, the light absorption of the resist becomes very great so that the profile is deteriorated and a rectangular pattern can not be obtained.

The purpose of the present invention is to improve the resolution in the novolac-quinonediazide type positive resists without lowering other resist performances excessively.

As the result of researches, the present inventors have found that the resolution of a novolac-quinonediazide type positive resist composition, which comprises an alkali-soluble novolac resin and a radiation-sensitive quinonediazide compound, can be improved by adding a certain compound. Thus, the present invention was completed.

SUMMARY OF THE INVENTION

The present invention provides a positive resist composition which comprises a novolac resin, a radiation-sensitive quinonediazide compound and a thioxanthone compound represented by the following formula (I):

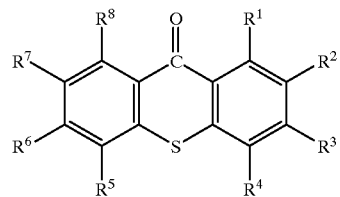

(I)

wherein $R^1$, $R^2$, $R^3$, $R^4$, $R^5$, $R^6$, $R^7$ and $R^8$ independently represent hydrogen, halogen, alkyl, alkoxy, aryl, carboxyl or alkoxycarbonyl.

DETAILED DESCRIPTION OF THE INVENTION

The resist composition of the invention comprises a novolac resin as an alkali-soluble ingredient and a quinonediazide compound as a radiation-sensitive compound. A novolac resin commonly used as an alkali-soluble ingredient in this kind of positive resist composition may be used as the novolac resin comprised in the positive resist of the present invention. This can usually be obtained by condensing a phenol compound and an aldehyde in the presence of an acid catalyst.

Examples of the phenol compound used in the preparation of the novolac resin include phenol, o-cresol, m-cresol, p-cresol, 2,3-xylenol, 2,5-xylenol, 3,4-xylenol, 3,5-xylenol, 2,3,5-trimethylphenol, 2-tert-butylphenol, 3-tert-butylphenol, 4-tert-butylphenol, 2-tert-butyl-4-methylphenol, 2-tert-butyl-5-methylphenol, 2-methylresorcinol, 4-methylresorcinol, 5-methylresorcinol, 2-methoxyphenol, 3-methoxyphenol, 4-methoxyphenol, 2,3-dimethoxyphenol, 2,5-dimethoxyphenol, 3,5-dimethoxyphenol, 2-methoxyresorcinol, 4-tert-butylcatechol, 2-ethylphenol, 3-ethylphenol, 4-ethylphenol, 2,5-diethylphenol, 3,5-diethylphenol, 2,3,5-triethylphenol, 2-naphthol, 1,3-dihydroxynaphthalene, 1,5-dihydroxynaphthalene, 1,7-dihydroxynaphthalene and a polyhydroxytriphenylmethane compound obtainable by condensation of xylenol and hydroxybenzaldehyde. These phenol compounds can be used singly or in combination of two or more.

Examples of the aldehyde used in the preparation of the novolac resin include aliphatic aldehydes such as formaldehyde, acetaldehyde, propionaldehyde, n-butylaldehyde, iso-butylaldehyde, pivalaldehyde, n-hexylaldehyde, acrolein and crotonaldehyde; alicyclic aldehydes such as cyclohexanealdehyde, cyclopentanealdehyde, furfural and furylacrolein; aromatic aldehydes such as benzaldehyde, o-methylbenzaldehyde, m-methylbenzaldehyde, p-methylbenzaldehyde, p-ethylbenzaldehyde, 2,4-dimethylbenzaldehyde, 2,5-dimethylbenzaldehyde, 3,4-dimethylbenzaldehyde, 3,5-dimethylbenzaldehyde, o-hydroxybenzaldehyde, m-hydroxybenzaldehyde, p-hydroxybenzaldehyde, o-anisaldehyde, m-anisaldehyde, p-anisaldehyde and vanillin; and aromatic-aliphatic aldehydes such as phenylacetaldehyde and cinnamaldehyde. These aldehydes can be used singly or in combination of two or more. Among these aldehydes, formaldehyde is preferably used because of easy availability in the industry.

Examples of the acid catalyst used for condensation of the phenol compound with the aldehyde compound include inorganic acids such as hydrochloric acid, sulfuric acid, perchloric acid and phosphoric acid; organic acids such as formic acid, acetic acid, oxalic acid, trichloroacetic acid and p-toluenesulfonic acid; and bivalent metal salts such as zinc acetate, zinc chloride and magnesium acetate. These acid catalysts can be used singly or in combination of two or more. The condensation reaction can be carried out according to the usual manner, for example, at a temperature within a range of 60 to 120° C. for 2 to 30 hours.

It is preferred that the amount of low-molecular weight components of the novolac resin obtained by the condensation is reduced by a treatment such as fractionation. Specifically, it is preferred that the amount of components having a molecular weight of 1,000 or less are reduced to 25% or less based on the total amount of the novolac resin excluding unreacted phenol compound, when the amounts are represented by the pattern areas of gel permeation chromatography (GPC), wherein the pattern areas refer to values measured by an UV detector at 254 nm and the molecular weight refer to a value based on that of polystyrene as a standard.

It is also effective to add a low molecular weight alkali-soluble phenol compound having a molecular weight of 1,000 or less to the novolac resin in which high-molecular weight components were enhanced. Such a low molecular weight alkali-soluble phenol compound preferably has at least two phenolic hydroxyl groups in the molecular structure. Examples thereof include compounds disclosed in JP-A-2-275955 (corresponding to U.S. Pat. No. 5,456,955 plus U.S. Pat. No. 5,456,996), JP-A-2-2560 or JP-A-4-37750. When the low molecular weight alkali-soluble phenol compound is used, it is preferred that such compound is present within a range of 3 to 40% by weight based on the total amount of the novolac resin and the low molecular weight alkali-soluble phenol compound. This low molecular weight alkali-soluble phenol compound can be deemed a part of alkali-soluble ingredient in the present invention.

A quinonediazide compound generally used as the radiation-sensitive ingredient for a usual novolac-quinonediazide type positive resist can be used as the radiation-sensitive quinonediazide compound used in the present invention. Usually, it is an o-quinonediazide sulfonic acid ester of a compound having a phenolic hydroxyl group. Preferably, it is a 1,2-naphthoquinonediazide-5- or 4-sulfonic acid ester or a 1,2-benzoquinonediazide-4-sulfonic acid ester of a polyhydroxyl compound having at least three phenolic hydroxyl groups. These radiation-sensitive quinonediazide compounds can also be used singly or in combination of two or more.

These esters can be obtained by reacting a compound having a phenolic hydroxyl group as described above with an o-quinonediazidesulfonyl halide in the presence of a base such as triethylamine or the like in a suitable solvent. After completion of the reaction, the desired quinonediazidesulfonic acid ester can be isolated by appropriate post treatment. Such post treatment includes, for example, a method in which the reaction mass is mixed with water to precipitate the desired compound, which is filtered and dried to give the product in powder form; and a method in which the reaction mass is treated with a resist solvent such as 2-heptanone or the like, washed with water, phase-separated, stripped of the solvent by distillation or equilibrium flash distillation to give the product in the form of a solution in a resist solvent, and others. The equilibrium flash distillation here refers to a kind of continuous distillation that is performed by evaporating a part of a liquid mixture, contacting sufficiently the produced vapor phase with the liquid phase, and separating the vapor and liquid phases when the equilibrium is attained. This method is suitable to concentration of heat sensitive substance, because the evaporation efficacy is very good, the evaporation occurs in a moment and the equilibrium between the vapor and liquid phases is rapidly attained.

The ratio between the alkali-soluble ingredient, which contains the novolac resin and optional low-molecular weight alkali-soluble phenolic compound, and the radiation-sensitive quinonediazide compound in the positive resist composition of the invention may vary depending on the type of the resist. Generally the ratio is selected within a range of about 10 to 100 parts by weight of the quinonediazide compound based on 100 parts by weight of the total of the alkali-soluble ingredient. The preferred content of the quinonediazide compound is about 10 to 50 parts by weight based on 100 parts by weight of the alkali-soluble ingredient.

The positive resist composition of the invention comprises the thioxanthone compound represented by the formula (I) described above in addition to the alkali-soluble ingredient and the quinonediazide compound. In the definition for the formula (I), halogen may include fluorine, chlorine, bromine and the like; alkyl and alkoxy, including alkoxy moiety in the alkoxycarbonyl, may have about 1 to 6 carbon atoms, respectively; and aryl may be phenyl or naphthyl. The phenyl and naphthyl as aryl maybe substituted, for example, by alkyl having about 1 to 6 carbon atoms, alkoxy having about 1 to 6 carbon atoms, halogen or nitro. Specifically, examples of the thioxanthone compound of the formula (I) include thioxanthone, 1-chlorothioxanthone, 2-chlorothioxanthone, 3-chlorothioxanthone, 4-chlorothioxanthone, 1-methylthioxanthone, 2-methylthioxanthone, 3-methylthioxanthone, 4-methylthioxanthone, 1-ethylthioxanthone, 2-ethylthioxanthone, 3-ethylthioxanthone, 4-ethylthioxanthone, 1-isopropylthioxanthone, 2-isopropylthioxanthone, 3-isopropylthioxanthone, 4-isopropylthioxanthone, methyl thioxanthone-1-carboxylate, methyl 7-methylthioxanthone-3-carboxylate 2,4-diethyithioxanthone, 2,7-diethyithioxanthone, 3-methoxythioxanthone, 1-chloro-4propoxythioxanthone, 2-(trifluoromethyl) thioxanthone, 2-bromothioxanthone, and hycanthone.

These thioxanthone compounds can be used singly or in combination of two or more. It is generally preferred that amount of the thioxanthone compound is about from 0.01 to 5 parts by weight based on 100 parts by total weight of the novolac resin and a low molecular weight alkali-soluble phenol compound. When the amount is too small, the effect of the present invention is insufficient. When the amount is too much, the sensitivity becomes lower.

The positive resist composition of the present invention comprises the novolac resin described above, quinonediazide compound and the thioxanthone compound as the essential ingredients. In addition, the positive resist composition of the present invention may comprise a resin other than the novolac resin, as well as a small amount of various additives conventional in this field, such as a dye, a surfactant and the like, as required. In addition, it is also effective to utilize a compound degradable by alkali, such as an acid generating agent, proposed in JP-A-10-213905, which generates an acid by the action of an alkali-developing solution. Addition of the alkali-degradable compound may contribute to the improvement of pattern profile.

The positive resist composition of the present invention is applied on a substrate such as a silicon wafer or the like in the form of a resist solution prepared by dissolving the ingredients described above in a solvent. Any solvent which can dissolve the ingredients, has an appropriate drying rate and can make a uniform and smooth coating film after the evaporation of the solvent can be used for the resist solution. The solvent may be one conventionally used in this field. Examples of the solvent include glycol ether esters such as ethyl cellosolve acetate, methyl cellosolve acetate, propylene glycol monomethyl ether acetate and propylene glycol monoethyl ether acetate; glycol ethers such as ethyl cellosolve, methyl cellosolve, propylene glycol monomethyl ether and propylene glycol monoethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents can be used singly or in combination of two or more.

The resist film formed by applying the resist solution and drying is irradiated with radiation rays for patterning. Then, after a post-exposure baking is conducted, if necessary, the irradiated resist film is developed with an alkali developer. The alkali developer used here can be various aqueous alkali solutions which are known in this field. Widely used developers generally include an aqueous solution of tetramethyl ammonium hydroxide and an aqueous solution of (2-hydroxyethyl) trimethyl ammonium hydroxide (generally called as choline).

EXAMPLES

The invention will now be described in more specifically with reference to Examples, which should not be construed as a limitation upon the scope of the invention. In Examples, percentages, parts and ratios representing the content or the used amount are weight based unless otherwise specified. The weight average molecular weight is a value measured by GPC using polystyrene as a standard.

Reference Example 1

Preparation of a Novolac Resin

Into a reaction vessel were charged 479.7 parts of a mixed m-/p-cresol comprising 62% of m-cresol, 115.1 parts of p-cresol, 268.75 parts of 2,5-xylenol, 39.3 parts of oxalic acid dihydrate, 261.8 parts of 90% aqueous acetic acid solution and 803.1 parts of methyl isobutyl ketone and the mixture was heated to 80° C. To this mixture was added drop wise 463.2 parts of 37% formalin over 30 minutes. The mixture was heated up to 92° C. and allowed to react at this temperature for 13 hours keeping reflux. After the reaction was terminated, 486.2 parts of methyl isobutyl ketone were added and the mixture was washed with 1823.2 parts of water, followed by a separation of the oily phase. This operation was repeated 6 times. Thereafter, the oily phase was concentrated to give a solution of a novolac resin in methyl isobutyl ketone. The resin had a weight average molecular weight of about 4,400. The solution was diluted with methyl isobutyl ketone to a concentration of 20%. To 400 parts of the 20% solution were added 545.2 parts of n-heptane with stirring. The mixture was stirred further at 60° C. for 30 minutes, left to stand and subjected to phase-separation. Then, 76.3 parts of the lower layer was diluted with 400 parts of 2-heptanone and concentrated to give 109.7 parts of a solution of the novolac resin in 2-heptanone. The novolac resin was referred to as Resin A. The resin had a weight average molecular weight of about 7,200 and a ratio of area in GPC pattern of a range corresponding to 1,000 or less in the molecular weight of about 20%.

Reference Example 2

Preparation of Novolac Resin

Into a reaction vessel were charged 486.6 parts of m-cresol, 219.6 parts of 2,5-xylenol, 31.8 parts of oxalic acid dihydrate, 214.2 parts of 90% aqueous acetic acid solution and 635.0 parts of methyl isobutyl ketone and the mixture was heated to 80° C. To this mixture was added drop wise 450.9 parts of 37% formalin over 30 minutes. The mixture was heated up to 92° C. and allowed to react at this temperature for 11 hours keeping reflux. After the reaction was terminated, 461.5 parts of methyl isobutyl ketone were added and the mixture was washed with 1500 parts of water, followed by a separation of oily phase. This operation was repeated 6 times. Then, oily phase was concentrated to give a solution of a novolac resin in methyl isobutyl ketone. The resin had a weight average molecular weight of about 4,800. The solution was diluted with methyl isobutyl ketone to a concentration of 22%. To 400 parts of the 22% solution were added 271.2 parts of n-heptane with stirring. The mixture was stirred further at 60° C. for 30 minutes, left to stand and subjected to phase-separation. Then, 91.4 parts of the lower layer was diluted with 400 parts of 2-heptanone and concentrated to give 135.8 parts of a solution of the novolac resin in 2-heptanone. The novolac resin was referred to as Resin B. The resin had a weight average molecular weight of about 6,100 and a ratio of area in GPC pattern of a range corresponding to 1,000 or less in the molecular weight of about 20%.

Examples 1-4 and Comparative Examples 1-2

Into 2-heptanone as a solvent were mixed and dissolved 11 parts in total of the novolac resins A and B obtained in Reference Examples 1 and 2, in ratios, as a solid ingredient, shown in Table 1, 4 parts of 4,4'-(2-hydroxybenzilidene)di-2,6-xylenol as an additive (a low-molecular weight phenol compound), 6 parts of a condensate (in powder form) of 2,6-bis[4-hydroxy-3-(2-hydroxy-5-methylbenzyl)-2,5-dimethylbenzyl]-4-methylphenol represented by the following formula:

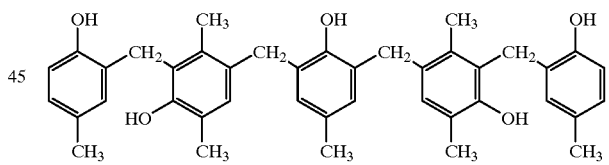

with 1,2-naphthoquinonediazide-5-sulfonyl chloride in the reaction molar ratio of 1:2.2 as a radiation-sensitive ingredient, a thioxanthone compound listed below in an amount respectively shown in Table 1, and 2-heptanone, as the solvent, so that the total amount of 2-heptanone including the amount derived from the solution of the novolac resin was 50 parts.

Thioxanthone Compound:
  D: thioxanthone
  E: 2-chlorothioxanthone
  F: "KAYACURE ITX" available from Nippon Kayaku Co., Ltd.(a mixture of 2-isopropylthioxanthone and 4-isopropylthioxanthone)

The respectively obtained solutions were filtered by a fluorine resin filter to give resist solutions. The resist solutions were spin-coated on silicon wafers treated with hexamethylsisilazane and subjected to the pre-baking treatment at 90° C. for 60 seconds on a direct hot-plate to form resist films having a thickness of 0.85 μm. The wafers carrying the resist films were exposed using a line-and space pattern varying stepwise the exposure amount using an i-ray stepper ("NSR-2005 i9C", manufactured by Nikon Co., Ltd., NA=0.57, σ=0.60). Then, they were subjected to post-exposure baking under conditions of 110° C. and 60 seconds on a hot plate, followed by paddle development using a 2.38% aqueous tetramethyl ammonium hydroxide solution for 60 seconds.

The developed patterns were observed by a scanning electron microscope. The effective sensitivity and resolution for respective patterns were evaluated in the following manners. The results are shown in Table 1.

Effective sensitivity: This was expressed by an exposure amount at which the cross-sections of 0.40 μm line-and-space pattern were 1:1.

Resolution: This was expressed by the minimum line width in the line-and-space pattern which was separated upon exposure at the effective sensitivity.

TABLE 1

| No. | Resin | Thioxan- thone Compound | Effective Sensi- tivity | Resolution |
|---|---|---|---|---|
| Example 1 | A/B = 30/70 | 0.2 part D | 310 msec | 0.255 μm |
| Example 2 | A/B = 30/70 | 0.2 part E | 350 msec | 0.25 μm |
| Example 3 | A/B = 30/70 | 0.2 part F | 350 msec | 0.25 μm |
| Example 4 | A/B = 15/85 | 0.3 part F | 350 msec | 0.25 μm |
| Comparative example 1 | A/B = 30/70 | not used | 200 msec | 0.30 μm |
| Comparative example 2 | A/B = 60/40 | not used | 360 msec | 0.27 μm |

As seen from Table 1, the products in Examples have an improved resolution as compared with the products in Comparative Examples. Although the product in Comparative Example 2 has a somewhat improved resolution, it has a reduced sensitivity. On the other hand, the products in Examples still have a superior sensitivity and a superior resolution to those of Comparative Example 2.

Reference Example 3

Preparation of a Radiation-Sensitive Quinonediazide Compound

Into 403 parts of dioxane were dissolved 40.63 parts of 2,6-bis[4-hydroxy-3-(2-hydroxy-5-methylbenzyl)-2,5-dimethylbenzyl]-4-methylphenol and 40 parts of 1,2-naphthoquinonediazide-5-sulfonyl chloride (the molar ratio was 1:2.2). To this mixture were added dropwise 18.1 parts of triethylamine, and the mixture was allowed to react until 1,2-naphthoquinonediazide-5-sulfonyl chloride was not detected. After the reaction was terminated, the reaction mass was stirred with 4.5 parts of acetic acid for 1 hour, and washed with 297 parts of 2-heptanone and 403 parts of deionized water to remove metallic substance and chlorine ion. After phase-separation, 2-heptanone layer was subjected to the equilibrium flash distillation, in which the vapor and liquid phases were contacted and separated when the equilibrium is attained, and concentrated until the solid content was 37.5%. In this manner, 159.0 parts of a solution of the quinonediazide sulfonic acid ester in 2-heptanone was obtained.

The procedure in Example 3 was repeated except that the radiation-sensitive ingredient in powder form was replaced by the solution of the quinonediazide sulfonic acid ester (6 parts, as the solid ingredient) in 2-heptanone obtained in Reference Example 3 and the total amount of 2-heptanone including the amount from the solution was adjusted to 50 parts. Results similar to those in Example 3 were obtained.

According to the present invention, a positive resist composition having a superior resolution can be obtained by adding a thioxanthone compound to a novolac resin and a quinonediazide compound. In addition, the composition has good resist performances such as sensitivity, depth of focus, profile and so on. Therefore, the composition is effective in the production of finer semiconductor integrated circuit.

What is claimed is:

1. An article comprising a substrate comprising a silicon water and a positive resist composition comprising a novolac resin; an o-quinonediazide sulfonic acid ester of a compound having a phenolic hydroxyl group; and a thioxanthone compound represented by the following formula (I);

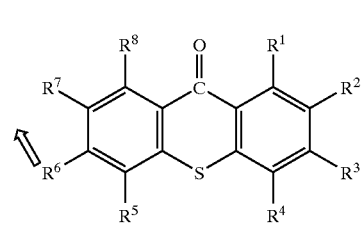

(I)

wherein $R^1$, $R^2$, $R^3$, $R^4$, $R^5$, $R^6$, $R^7$, $R^8$ independently represent hydrogen, halogen, alkyl, alkoxy, aryl, carboxyl or alkoxycarbonyl.

2. The article of claim 1, wherein in the positive resist composition the amount of components of the novolac resin having a molecular weight of 1,000 or less is 25% or less based on the total amount of the novolac resin excluding unreacted phenol compound, the amounts being represented by the pattern areas of gel permeation chromatography, wherein the pattern areas refer to values measured by an UV detector at 254 nm and the molecular weight refers to a value based on that of polystyrene as a standard.

3. The article of claim 1, wherein the positive resist composition which further comprises a low molecular weight alkali-soluble phenol compound in an amount within a range of 3 to 40% by weight based on the total amount of the novolac resin and the low molecular weight alkali-soluble phenol compound.

4. The article of claim 1, wherein in the positive resist composition the thioxanthone compound of the formula (I) is selected from thioxanthone, 1-chlorothioxanthone, 2-chlorothioxanthone, 3-chlorothioxanthone, 4-chlorothioxanthone, 1-methylthioxanthone, 2-methylthioxanthone, 3-methylthioxanthone, 4-methylthioxanthone, 1-ethylthioxanthone, 2-ethylthioxanthone, 3-ethylthioxanthone, 4-ethylthioxanthone, 1- isopropylthioxanthone, 2-isopropylthioxanthone, 3-isopropylthioxanthone, 4-isopropylthioxanthone, methyl thioxanthone-1-carboxylate or methyl 7-methylthioxanthone-3-carboxylate.

5. The article of claim 1, wherein in the positive resist composition the amount of the thioxanthone compound is from about 0.01 to about 5 parts by weight based on 100 parts by total weight of the novolac resin and a low molecular weight alkali-soluble phenol compound.

* * * * *